(12) United States Patent
Getz et al.

(10) Patent No.: US 10,591,300 B2
(45) Date of Patent: Mar. 17, 2020

(54) FIXING MAGNETOMETER BASED AZIMUTH ACCORDING TO SUN POSITIONING

(71) Applicant: RideOn Ltd., Haifa (IL)

(72) Inventors: Alon Getz, Haifa (IL); Avi Rogalsky, Netanya (IL); Samuel Alexander Rabinovich, Kiryat-Ata (IL)

(73) Assignee: RideOn Ltd., Haifa (IL)

( * ) Notice: Subject to any disclaimer, the term of this patent is extended or adjusted under 35 U.S.C. 154(b) by 153 days.

(21) Appl. No.: 15/956,780

(22) Filed: Apr. 19, 2018

(65) Prior Publication Data

US 2018/0313650 A1    Nov. 1, 2018

Related U.S. Application Data

(60) Provisional application No. 62/492,316, filed on May 1, 2017.

(51) Int. Cl.
    *G01C 17/38*     (2006.01)
    *G01R 33/028*    (2006.01)
    *G01R 33/26*     (2006.01)

(52) U.S. Cl.
    CPC .......... *G01C 17/38* (2013.01); *G01R 33/028* (2013.01); *G01R 33/26* (2013.01)

(58) Field of Classification Search
    CPC ....... G01C 17/38; G01R 33/028; G01R 33/26
    See application file for complete search history.

(56) References Cited

U.S. PATENT DOCUMENTS

| | | | |
|---|---|---|---|
| 2018/0172822 A1* | 6/2018 | Phillips | G01S 13/90 |
| 2018/0174312 A1* | 6/2018 | Phillips | G06T 7/30 |
| 2018/0191860 A1* | 7/2018 | Ghafourifar | H04L 67/32 |
| 2018/0275837 A1* | 9/2018 | Getz | G02B 27/017 |
| 2018/0313650 A1* | 11/2018 | Getz | G01C 17/38 |
| 2019/0147619 A1* | 5/2019 | Goldman | G06T 7/75 382/154 |
| 2019/0317220 A1* | 10/2019 | Kocer | G01S 19/46 |

OTHER PUBLICATIONS

Abd Rahim et al. "Image-Based Solar Tracker Using Raspberry Pi", Journal of Multidisciplinary Engineering Science and Technology, JMEST, 1(5): 369-373, Dec. 2014.

(Continued)

*Primary Examiner* — Yaritza Guadalupe-McCall

(57) ABSTRACT

A system for improving azimuth accuracy of a Line Of Sight (LOS) by adjusting an azimuth value obtained from one or more magnetometer based inertial sensors according to the sun position, comprising one or more magnetometer based inertial sensors, one or more imaging sensors, one or more location sensors and one or more processors coupled to the sensors. The processor(s) is adapted to execute a code comprising code instructions to: obtain location, elevation and time from the location sensor(s), obtain a sensor based azimuth value of a LOS of the imaging sensor(s) from the magnetometer based inertial sensor(s), obtain image(s) depicting the sun captured by the imaging sensor(s), calculate an actual azimuth value of the LOS according to the location, elevation and time with respect to a center of the sun computed by analyzing the image(s) and adjust automatically the sensor based azimuth value according to the actual azimuth value.

10 Claims, 2 Drawing Sheets

(56) References Cited

OTHER PUBLICATIONS

Arturo et al. "High-Precision Solar Tracking System", Proceedings of the World Congress on Engineering, WCE 2010, London, UK, Jun. 30-Jul. 2, 2010, 2: 1-3, Jun. 30, 2010.

Badran et al. "The Enhancement of Solar Distillation Using Image Processing and Neural Network Sun Tracking System", International Journal of Mining, Metallurgy & Mechanical Engineering, IJMMME, 1(3): 208-212, 2013.

Calonder et al. "BRIEF: Binary Robust Independent Elementary Features", ECCV'10 Proceedings of the 11th European Conference on Computer Vision, Heraklion, Crete, Greece, Sep. 5-11, 2010, Part IV: 778-792, Sep. 5, 2010.

Guo et al. "Correcting Over-Exposure in Photographs", 2010 IEEE Conference on Computer Vision and Pattern Recognition, CVPR, San Francsico, CA, USA, Jun. 13-18, 2010, p. 515-521, Jun. 13, 2010.

Karami et al. "Image Matching Using SIFT, SURF, BRIEF and ORB: Performance Comparison for Distorted Images", Faculty of Engineering and Applied Sciences, Memorial University, Canada, Conference Paper, 4 P., Nov. 2015.

Lowe "Object Recognition From Local Scale-Invariant Features", Proceedings of the 7th IEEE International Conference on Computer Vision, Kerkyra, Greece, Sep. 20-27, 1999, 2: 1150-1157, Sep. 20, 1999.

Prinsloo et al. "Solar Tracking: High Precision Solar Position Algorithms, Programs, Software and Source-Code for Computing the Solar Vector, Solar Coordinates & sun Angles in Microprocessor, PLC, Arduino, PIC and PC-Based Sun Tracking Devices or Dynamic Sun Following Hardware", Stellenbosch: SolarBooks, p. 1-542, 2015.

Rublee et al. "ORB: An Efficient Alternative to SIFT or SURF", 2011 IEEE International Conference on Computer Vision, ICCV, Barcelona, Spain, Nov. 6-13, 2011, p. 2564-2571, Nov. 6, 2011.

* cited by examiner

FIXING MAGNETOMETER BASED AZIMUTH ACCORDING TO SUN POSITIONING

RELATED APPLICATIONS

This application claims the benefit of priority under 35 USC § 119(e) of U.S. Provisional Patent Application No. 62/492,316, filed on May 1, 2017. The contents of the above applications are all incorporated by reference as if fully set forth herein in their entirety.

FIELD AND BACKGROUND OF THE INVENTION

The present invention, in some embodiments thereof, relates to adjusting a sensor based azimuth provided by a magnetometer based inertial sensor and, more particularly, but not exclusively, to adjusting a sensor based azimuth provided by a magnetometer based inertial sensor according to position of the sun.

Acquiring an accurate azimuth may be essential for a plurality of applications, for example, navigation systems, aircrafts and/or vessels Attitude and Heading Reference Systems (AHRS), Augmented Reality applications and/or the like.

While acquiring a relative orientation data, in particular azimuth may typically be straight forward, providing an absolute azimuth with respect to a fixed reference may present significant challenges. To overcome these challenges, some of the existing systems may typically use magnetometer based sensors that may provide the current azimuth with respect to the magnetic pole of earth.

SUMMARY OF THE INVENTION

According to a first aspect of the present invention there is provided a system for improving azimuth accuracy of a Line Of Sight (LOS) by adjusting an azimuth value obtained from one or more magnetometer based inertial sensors according to the sun position, comprising one or more magnetometer based inertial sensors, one or more imaging sensors, one or more location sensors and one or more processors coupled to the one or more magnetometer based inertial sensors, the one or more location sensors and the one or more imaging sensors, the one or more processors is adapted to execute a code, the code comprising:

Code instructions obtain a location, elevation and time from the one or more location sensors.
Code instructions obtain a sensor based azimuth value of a LOS of the one or more imaging sensors from the one or more magnetometer based inertial sensors.
Code instructions to obtain one or more images captured by the one or more imaging sensors, the one or more images depicting the sun.
Code instructions to calculate an actual azimuth value of the LOS according to the location, the elevation and the time with respect to a center of the sun computed by analyzing the one or more images.
Code instructions to adjust automatically the sensor based azimuth value according to the actual azimuth value.

Calibrating sensor based azimuth according to the actual azimuth calculated based on an absolute positioning of the sun may significantly improve accuracy of the azimuth produced by the magnetometer sensors which may typically be inherently inaccurate as well as susceptible to a plurality of external disruptions (e.g. local magnetic fields, radiation, etc.) that may degrade their operation, performance and/or accuracy. As the sun positioning is absolute, adjusting azimuth obtained from the magnetometer sensors according to a real azimuth calculated based on the sun positioning may significantly improve the azimuth accuracy. The calibration may be done once and applied to subsequent azimuth readings from the magnetometer sensors.

According to a second aspect of the present invention there is provided a computer implemented system of improving azimuth accuracy of a LOS by adjusting an azimuth value obtained from one or more magnetometer based inertial sensors according to the sun position, comprising:

Obtaining a location, elevation and time from one or more location sensor.
Obtaining a sensor based azimuth value of a LOS of one or more imaging sensors from one or more magnetometer based inertial sensors.
Obtaining one or more images captured by the one or more imaging sensors, the one or more images depicting the sun.
Calculating an actual azimuth value of the LOS according to the location, the elevation and the time with respect to center of the sun computed by analyzing the one or more images.
Adjusting automatically the sensor based azimuth value according to the actual azimuth value.

In a further implementation form of the first and/or second aspects, the one or more magnetometer based inertial sensors are provided by an Attitude and Heading Reference system (AHRS). The true azimuth adjustment may be applied to existing AHRS systems which may be wide spread and used for a plurality of application to improve accuracy of the AHRS azimuth readings.

In a further implementation form of the first and/or second aspects, the code further comprises code instruction to determine whether the sun is in a field of view of the one or more imaging sensors based on the location, the elevation and the time. This may prevent redundant computations and resource utilization in attempting to predict and locate the sun in the captured image(s) when the sun is cannot be depicted in the captured images, for example, at night, at geographical locations where the sun is invisible, due to different azimuth and/or elevation of the LOS of the camera compared to the estimated azimuth and elevation of the sun and/or the like.

In a further implementation form of the first and/or second aspects, the code further comprises code instructions to convert the one or more images to a binary image in which each pixel in the one or more images is represented by one of two pixel values. The image processing for identifying the center of the sun may be significantly improved by using binary images in which light regions (pixels) may be easily distinguishable.

In a further implementation form of the first and/or second aspects, the code instructions for calculating the actual azimuth value comprise code instructions for computing the center according to a perimeter of the sun identified in the one or more images by the analyzing which employs image processing. Image processing may be used to easily identify the perimeter of the sun and using simple geometrical equations, the positioning of the sun center may be computed.

In a further implementation form of the first and/or second aspects, the code instructions for calculating the actual azimuth value comprise code instructions for computing the center according to an intersection point of at least two sun light rays identified in the one or more images by the analyzing which employs image processing. In a cloudy weather when the sun may not be directly visible, the sun center positioning may be computed based on light rays penetrating the clouds layer.

In a further implementation form of the first and/or second aspects, the code instructions for calculating the actual azimuth value comprise code instructions for computing the center by identifying an inner perimeter and an outer perimeter of a halo of the sun identified in the one or more images by the analyzing which employs image processing. During overcast weather conditions, when the sun may not be clearly visible, the sun center positioning may be computed based on the sun halo observed through the cast.

In a further implementation form of the first and/or second aspects, the code further comprising code instructions to analyze one or more additional images captured by the one or more imaging sensors the to continuously maintain the adjusted sensor based azimuth value according to the actual azimuth value. Repeating the actual azimuth computation to adjust and/or calibrate the magnetometer based sensor azimuth may prevent drifting in the magnetometer based sensor azimuth. The actual azimuth computation may be computed periodically (time based), following one or more changes in the geographical location and/or elevation (geography based) and/or on demand by one or more users, applications and/or services requesting the current azimuth.

In a further implementation form of the first and/or second aspects, the code further comprising code instructions to calibrate a positioning of the one or more imaging sensors compared to the positioning of the one or more magnetometer based inertial sensors to align the LOS with the one or more magnetometer based inertial sensors. Setting an accurate reference plane (align) between the 3D space coordinates of the LOS of the image sensors and the 3D space coordinates of the magnetometer based inertial sensors may be essential to properly calibrate the readings obtained from the magnetometer based inertial sensors according to the image processing which may rely on the LOS.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1:
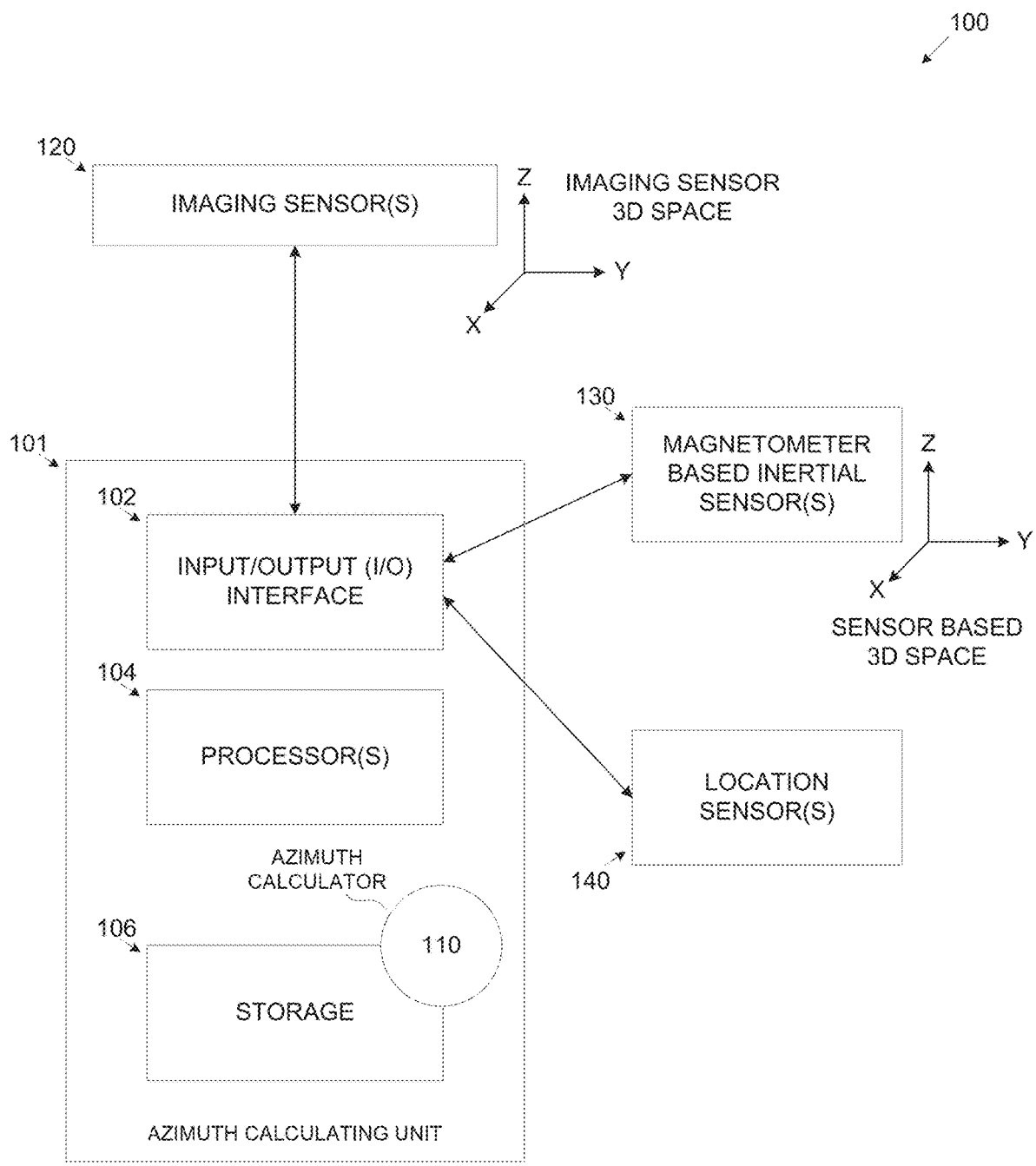
FIG. 1 is a schematic illustration of an exemplary system for adjusting a sensor based azimuth provided by a magnetometer based inertial sensor according to position of the sun, according to some embodiments of the present invention.

The present invention, in some embodiments thereof, relates to adjusting a sensor based azimuth provided by a magnetometer based inertial sensor and, more particularly, but not exclusively, to adjusting a sensor based azimuth provided by a magnetometer based inertial sensor according to position of the sun.

According to some embodiments of the present invention, there are provided methods, systems and computer program products for adjusting a sensor based azimuth obtained from one or more magnetometer based inertial sensors according to an actual azimuth calculated according to a current location, elevation and time with respect to an absolute position of the sun identified by analyzing one or more images captured by one or more imaging sensor(s).

The magnetometer based inertial sensor(s), for example, an accelerometer, a gyroscope, an IMU, an AHRS and/or the like provide azimuth, orientation, movement, and/or position information (readings). Based on information provided by one or more integrated magnetometer sensors, the magnetometer based inertial sensor(s) may provide absolute azimuth values with respect to the magnetic pole of earth.

The imaging sensor(s), for example, a camera, a video camera and/or the like may capture one or more images depicting the sun. Typically, the magnetometer based inertial sensor(s) are aligned with the imaging sensor(s) such that both share a common reference for their respective three dimensional (3D) space coordinate systems. This may be essential to set a known offset between the azimuth, orientation, movement, and/or position readings reported by the magnetometer based inertial sensor(s) and the Field Of View (FOV) of the imaging sensor(s) and in particular with the Line Of Sight (LOS) of the imaging sensor(s). The LOS may typically be the reference for all azimuth readings, for example, in head mount Augmented Reality (AR) systems, in AHRS supported navigation systems, in attitude management systems and/or the like.

One or more location sensors, for example, a GPS, an altitude sensor, a tracking device, a navigation system and/or the like may provide current (geographical) location, elevation and time information.

One or more image(s) captured by the imaging sensor(s) may be analyzed to identify the sun, in particular the center of the sun. Optionally, the image(s) are analyzed after converted to binary image(s) in which each pixel is represented by one of two distinct binary values (0 and 1). One or more image processing algorithms may be applied to the captured image(s) and/or the binary image(s) to identify and compute an absolute positioning of the center of the sun.

Based on the current location, elevation and time and the absolute positioning of the center of the sun, the actual current azimuth may be calculated.

The magnetometer based inertial sensor(s) may then be calibrated by adjusting their sensor based azimuth with the calculated offset from the actual azimuth. The true azimuth may thus be computed by adjusting the sensor based azimuth with the offset calculated with respect to the actual azimuth.

Optionally, in order to maintain an accurate azimuth through one or more condition changes, for example, time change, location change, elevation change and/or the like the process for calculation the actual azimuth may be repeated continuously, periodically, at detection of condition changes and/or upon request.

Calibrating sensor based azimuth according to the actual azimuth calculated based on an absolute positioning of the sun may present significant advantages compared to existing systems and/or methods for azimuth calculation, in particular magnetometer based systems. Magnetometer sensors may typically be inaccurate and may further be susceptible to a plurality of external disruptions that may degrade their operation, performance and/or accuracy, for example, local magnetic fields, radiation and/or the like. The sun position on the other hand may be absolute and by calculating the actual azimuth based on the current geographical location, elevation and time, the calculated actual azimuth may be significantly more accurate than the sensor based azimuth provided by the magnetometer based inertial sensor(s). Therefore, by calibrating the magnetometer based inertial sensor(s) according to the actual azimuth may present a significantly more accurate real azimuth.

The calibration may be done once and applied to subsequent azimuth readings from the magnetometer sensors. Optionally, the calibration may be repeated for the subsequent azimuth readings from the magnetometer sensors, for example, periodically for a subset of azimuth readings, for each of the azimuth readings, every predefined period of time, following a change to the geographical location and/or elevation and/or the like.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages.

The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Referring now to the drawings, FIG. 1 is a schematic illustration of an exemplary system for adjusting a sensor based azimuth provided by a magnetometer based inertial sensor according to position of the sun, according to some embodiments of the present invention. An exemplary system 100 includes an azimuth calculating unit 101 comprising an Input/output (I/O) interface 102, a processor(s) 104 and a storage 106.

The system 100 includes one or more imaging sensors 120, for example, a camera, a video camera and/or the like.

The system 100 includes one or more magnetometer based inertial sensors 130, for example, an accelerometer, a gyroscope, an IMU, an AHRS and/or the like which provide azimuth, orientation, movement, and/or position information (readings). Based on information provided by one or more integrated magnetometer sensors, the magnetometer based inertial sensors 130 may provide absolute azimuth values with respect to the magnetic pole of earth.

The system 100 includes one or more location sensors 140, for example, a GPS, an altitude sensor, a tracking device, a navigation system and/or the like which provide current (geographical) location, elevation and time information.

In some embodiment of the present invention, one or more of the imaging sensor(s) 120, the magnetometer based inertial sensor(s) 130 and/or the location sensor(s) 140 are integrated with the azimuth calculating unit 101.

The I/O interface 102 may include one or more wired and/or wireless interfaces, ports, channels and/or the like for connecting to one or more sensors, peripheral devices, networks and/or the like. In particular, the I/O interface 102 includes one or more interfaces for connecting to the imaging sensor(s) 120, the magnetometer based inertial sensor(s) 130 and/or the location sensor(s) 140.

The processor(s) 104 may comprise one or more one or more processors (homogenous or heterogeneous), which may be arranged for parallel processing, as clusters and/or as one or more distributed core processing units.

The storage 106 may include one or more non-transitory persistent storage devices, for example, a Read Only Memory (ROM), a Flash device, a hard drive, an attachable storage media and/or the like. The storage medium may further include one or more volatile storage devices, for example, a random access memory (RAM) for temporary store of code and/or data.

The processor(s) 104 may execute one or more software modules, for example, a process, an application, an agent, a utility, a service and/or the like wherein a software module refers to a plurality of program instructions executed by a processor such as the processor(s) 104 from a program store such as the storage 106. The processor(s) 104 may execute, for example, an azimuth calculator 110 for calculating an actual azimuth for the Line Of Sight (LOS) of imaging sensor(s) 120.

The magnetometer based inertial sensor(s) 130 may be aligned with the imaging sensor(s) 120 such that the 3D space as depicted by the imaging sensor(s) 120 and the 3D space the magnetometer based inertial sensor(s) 130 use for reporting the azimuth, orientation, movement, and/or position readings have a common reference that is known. The common reference may be denoted by a known offset—a Magnetometer based inertial sensor Offset (MO) expressed, for example, as an angle (in degrees) between the coordinates system (X, Y, Z) of the magnetometer based inertial sensor(s) 130 and the coordinates system (X, Y, Z) of the imaging sensor(s) 120, in particular, the LOS of the imaging sensor(s) 120. The alignment may be done with respect to one or more reference points in the Field Of View (FOV) of the imaging sensor(s) 120, for example, the center of the FOV, a corner of the FOV and/or the like. The alignment may be essential to define a common reference between the (3D) space of the imaging sensor(s) 120 and the 3D space of the magnetometer based inertial sensor(s). The alignment may be done through mechanical means for adapting the physical location, orientation and/or positioning of the imaging sensor(s) 120 and the magnetometer based inertial sensors 130 with respect to each other. The alignment may further be known and/or measured and may be compensated for by the azimuth calculator 110.

Figure 2:
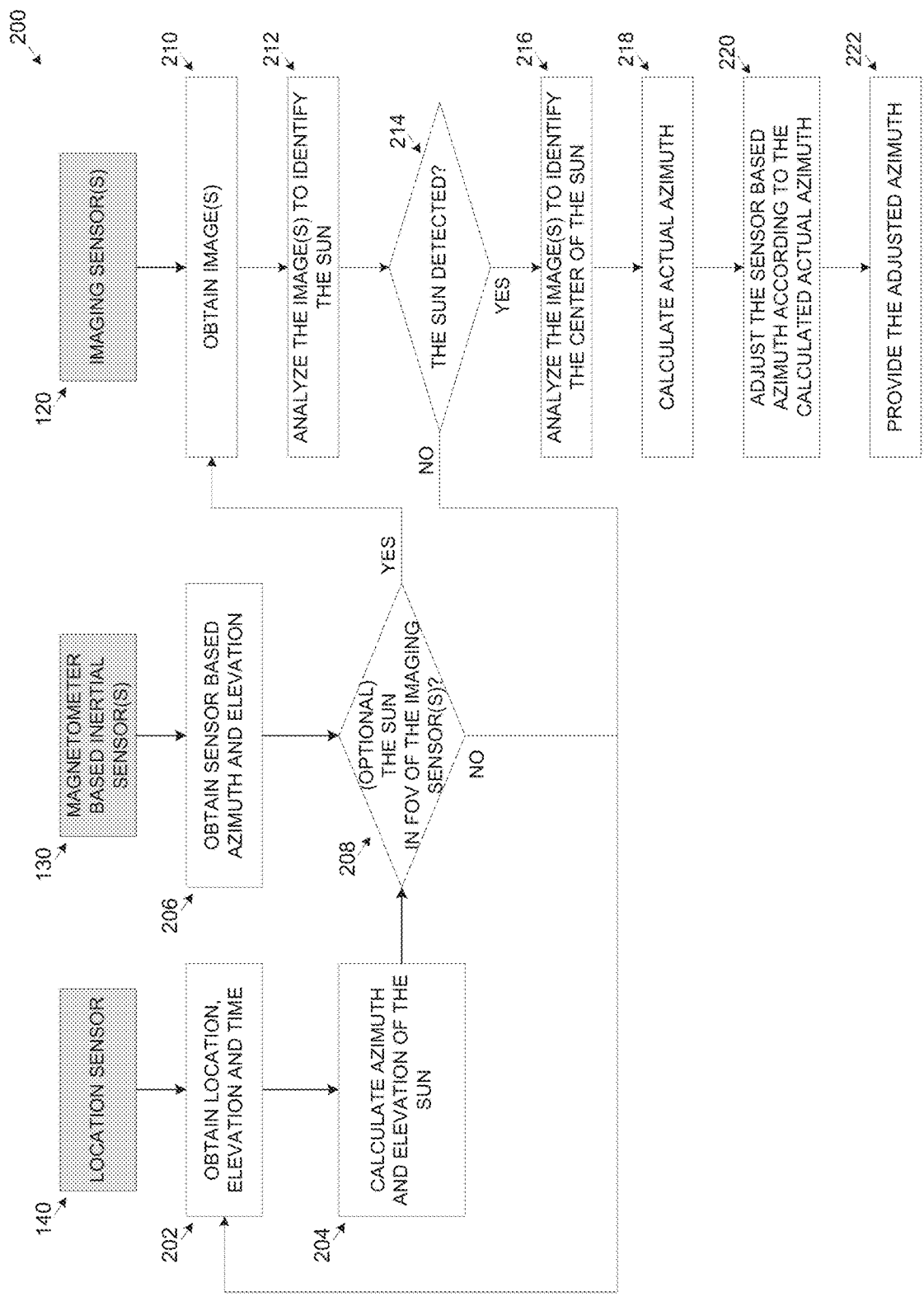
FIG. 2 is a flowchart of an exemplary process of adjusting a sensor based azimuth provided by a magnetometer based inertial sensor according to position of the sun, according to some embodiments of the present invention.

Reference is also made to FIG. 2, which is a flowchart of an exemplary process of adjusting a sensor based azimuth provided by a magnetometer based inertial sensor according to position of the sun, according to some embodiments of the present invention. An exemplary process 200 may be executed by the azimuth calculator 110 in the system 100 to calculate an actual azimuth (may also be regarded as true azimuth or real azimuth) by analyzing on or more images captured by the imaging sensor(s) 120, identifying the sun, in particular the sun center and based on a current (geographical) location, elevation and time of day compute the actual azimuth with according to the identified sun center. The azimuth calculator 110 may then adjust a sensor based azimuth received from the magnetometer based inertial sensor(s) 130 according to the calculated actual azimuth to calibrate the magnetometer based inertial sensor(s) 130. The azimuth calculator 110 may compute an offset between the sensor based azimuth and the actual azimuth such that future (future) values received from the sensor based azimuth may be adjusted with the offset. Additionally and/or alternatively, the process 200 may be repeated to calculate an updated actual azimuth every predefined period of time and/or under dynamically set conditions, for example, every minute, every hour, at detection of an orientation change, at detection of a change in the sensor based azimuth that exceeds a certain predefined threshold and/or the like.

As shown at 202, the azimuth calculator 110 obtains values of the current geographical location, elevation and time from the location sensor(s) 140.

As shown at 204, based on the current geographical location, elevation and time, the azimuth calculator 110 may calculate an estimated a positioning, i.e. a range, a direction, an elevation and/or location of the sun relative to the current geographical location and elevation values obtained from the location sensor(s) 140.

As shown at 206, the azimuth calculator 110 obtains a sensor based azimuth value from the magnetometer based inertial sensor(s) 130. The azimuth calculator 110 may further obtain an elevation value from the magnetometer based inertial sensor(s) 130.

As shown at 208, which is an optional decision point, the azimuth calculator 110 may estimate whether the sun may be in the Field Of View (FOV) of the imaging sensor(s) 120. The azimuth calculator 110 may determine whether the sun is in the FOV by computing whether the estimated positioning of the sun is within the FOV which may be computed based on the sensor based azimuth value from the magnetometer based inertial sensor(s) 130. This is possible, since the magnetometer based inertial sensor(s) 130 and/or their readings may typically be aligned with the LOS of the imaging sensor(s) 120 thus aligned with the FOV of the imaging sensor(s) 120. In case the azimuth calculator 110 determines that the sun may be in the FOV, the process 200 branches to 210. In case the azimuth calculator 110 determines that the sun is not in the FOV, the process 200 may branch back to 202 and may start over immediately and/or in a predefined period of time, such that the process 100 is started over with updated current location, elevation and/or time.

The azimuth calculator 110 may estimate whether the sun is in range, i.e. in the FOV, for example, using the formula expressed in formula 1 below.

SunInRange=(abs(TA−STA)<AR)&&(abs(LOSE−STA)<ER)   Formula 1:

Where:

abs indicates the absolute value of the enclosed expression.

TA denotes True Azimuth, i.e. the actual azimuth the calculation of which is described herein after.

STA denotes Sun True Azimuth which is the estimated sun positioning relative to the current geographical location and elevation as calculated in step 204.

AR denotes Azimuth Range, i.e. the relevant range (interval) of the azimuth difference between the estimated sun azimuth (estimated in step 204) and the actual (true) azimuth to the sun which is calculated here in after based on the azimuth obtained from the magnetometer based inertial sensor(s) 130. The AR variable may indicate the azimuth range (interval) relevant for locating the sun's positioning in the FOV of the imaging sensor(s) 120. The AR value may depend on three main factors:
  (1) The functional FOV of the imaging sensor(s) 120 (derived from the hardware specification of the imaging sensor(s) 120).
  (2) Relevant (maximal) offset (in degrees) from the LOS of the imaging sensor(s) 120 that may allow detecting and/or computing the positioning of the sun.
  (3) A predefined initial error value that may be added in case the sensor based azimuth value was never adjusted and/or the most recent adjustment to the sensor based azimuth value exceeds a predefined time interval.

LOSE denotes Line Of Sight Elevation, i.e. an elevation value measured and provided by the magnetometer based inertial sensor(s) 130.

STE denotes Sun True Elevation, i.e. the value of the sun's elevation estimated (calculated) in step 204.

ER denotes Elevation Range, i.e. the relevant range (interval) of the elevation difference between the estimated sun positioning (estimated in step 204) and the elevation value obtained from the magnetometer based inertial sensor(s) 130. The ER variable may indicate the elevation range (interval) relevant for locating the sun's positioning in the FOV of the imaging sensor(s) 120. The ER may value depend on two main factors:
  (1) The functional FOV of the imaging sensor(s) 120 (derived from the hardware specification of the imaging sensor(s) 120).
  (2) Relevant (maximal) offset (in degrees) of the sun from the LOS of the imaging sensor(s) 120 that may allow detecting and/or computing the positioning of the sun.

Estimating the possibility to detect the sun in the FOV of the imaging sensor(s) 120, may allow the azimuth calculator 110 to determine whether searching for the sun in images captured by the imaging sensor(s) 120, i.e. whether the sun is in the FOV, is relevant. This may be beneficial to avoid redundant computations (the following steps of the process 100) in case the sun may not be visible currently. For example, based on the obtained current time, the azimuth calculator 110 may determine that the sun is below the horizon (e.g. at night) and may therefore not be visible in the FOV. In another example, the azimuth calculator 110 may determine, based on the current location and/or elevation, optionally coupled with the current time, that one or more obstacles may obscure the sun, for example, a mountain, a building and/or the like and the sun may therefore not be visible in the FOV.

As shown at 210, the azimuth calculator 110 obtains one or more images captured by the imaging sensor(s) 120.

As shown at 212, the azimuth calculator 110 analyzes the image(s) captured by the imaging sensor(s) 120 to detect the sun in the image(s). The azimuth calculator 110 may use one or more image processing algorithms, i.e. computer vision algorithms to detect the sun in the image(s).

The azimuth calculator 110 may convert the captured image(s) to respective binary images in which each pixel is represented by one of two pixel values according to, for example, the contrast identified for each of the pixels of the captured image(s).

The azimuth calculator 110 may apply one or more of the computer vision algorithms as known in the art, for example, Scale Invariant Feature Transform (SIFT), Speed Up Robust Feature (SURF), Robust Independent Elementary Features (BRIEF), Oriented FAST (Features from Accelerated Segment Test) and Rotated BRIEF (ORB) and/or the like for detecting the sun in the binary images. The azimuth calculator 110 may further apply one or more machine learning algorithms, for example, a neural network as known in the art, which may identify the sun using a database of images depicting the sun in one or more of a plurality of image capturing parameters for example, a geographical location, a weather condition, a time of day, a time of year and/or the like. In particular, the azimuth calculator 110 may apply the above mentioned exemplary computer vision algorithms when the weather is clear and the sun is visible in the captured images.

Under more challenging weather conditions, for example, presence of clouds that may intermittently obscure the sun, the azimuth calculator 110 may apply one or more methods, techniques and/or algorithms as known in the art for tracking objects under limited visibility conditions, for example, Object Recognition from Local Scale-Invariant Feature. Such algorithms may present sufficient results even for Low Dynamic Range (LDR) image(s) captured by the imaging sensor(s) 120.

As shown at 214, which is a decision point, in case the azimuth calculator 110 detects the sun in the captured image(s), the process 200 branches to 216. In case the azimuth calculator 110 is unable to detect the sun in the captured image(s), the process 200 may branch back to 202 and may start over immediately and/or in a predefined period of time and/or under one or more conditions, for example, a weather change, a change in the sensor based azimuth and/or the like such that the process 100 may start over with updated current location, elevation and/or time.

As shown in 216, the azimuth calculator 110 analyzes the captured image(s) and/or the binary images produced from the captured image(s) to identify the center of the sun. Since the sun is not a dot in space, in order to accurately calculate the actual azimuth, the azimuth calculator 110 needs to identify the center of the sun to serve as the reference point for calculating the actual azimuth.

Assuming the sun is fully depicted in the captured image(s), the azimuth calculator 110 may identify the center of the sun by detecting the perimeter line of the sun, for example, by analyzing the binary image(s) produced from the captured image(s). Using standard geometry formulas, the azimuth calculator 110 may calculate an approximated center of the circle formulated by the identified perimeter line.

In case the sun is partially visible, for example, behind clouds, behind an obstacle, the azimuth calculator 110 may use one or more of the computer vision algorithms as described herein above to analyze the binary image(s) produced from the captured image(s), for example, BRIEF to identify a partial perimeter of the sun (radians) and using geometry formulas approximate the positioning of center of the identified partial perimeter line.

In cases of cloudy weather and/or partial overcast, one or more sun light rays (beams) that have penetrated the clouds and/or overcast may be depicted in the captured image(s). In the binary image(s) produced from the captured image(s), each sun light ray may appear as a trapezoid in the two dimensional (2D) image. The azimuth calculator 110 may identify a plurality (at least two) such trapezoids (indicating sun light rays) and compute an intersecting point for the extensions of the trapezoids. The intersection point may be considered as the approximated positioning of the center of the sun. Naturally, the accuracy of the approximation is improved with every additional sun light ray (trapezoid in the binary image(s)) used by the azimuth calculator 110 to compute the positioning of the center of the sun.

In cases of overcast when the sun is completely obscured by the overcast, the sun may be visible as a hazy object having a halo. The azimuth calculator 110, optionally using one or more of the computer vision algorithms, may identify an inner perimeter line of the halo and an outer perimeter line of the halo. The azimuth calculator 110 may further apply one or more algorithms, tools, filters and/or the like, for example, dynamic threshold setting, image shape approximation and/or the like to improve the roundness of one or more of the identified inner and/or outer perimeter lines. Using standard geometry formulas, the azimuth calculator 110 may calculate the approximated positioning of center of the sun. Naturally, since the inner perimeter line defining the region (shape) of the sun body, the pixels in this region may be more evident (brighter) in the produced binary image(s) than the region defined between the inner and outer perimeter lines of the halo. The azimuth calculator 110 may therefore assign higher significance to the location, positioning and/or the like of the inner perimeter line and/or the pixels included with the inner perimeter line. The significance may be expressed through weights corresponding to the significance. Using the inner and outer perimeter lines, optionally weighted, the azimuth calculator 110 may compute the positioning of the center of the sun.

As shown at 218, the azimuth calculator 110 may calculate the actual azimuth of the LOS of the imaging sensor(s) 120 according to the absolute positioning of the sun, in particular the positioning of the center of the sun as known in the art.

As shown at 218, the azimuth calculator 110 may calculate the actual azimuth of the LOS of the imaging sensor(s) 120. The azimuth calculator 110 may compute the absolute positioning of the sun, in particular the absolute positioning of the center of the sun using one or more methods, algorithms and/or the like as known in the art. The azimuth calculator 110 may then calculate the actual azimuth based on the geographical location, elevation and time information obtained from the location sensor(s) 140 with respect to the absolute positioning of the center of the sun.

As shown at 220, the azimuth calculator 110 may adjust the sensor based azimuth according to the calculated actual azimuth to provide a true azimuth. For example, once the actual azimuth is calculated, the azimuth calculator 110 may compute an offset—a True Azimuth Fix (TAF) between the sensor based azimuth and the actual azimuth. Afterwards the sensor based azimuth may be adjusted with the computed offset for whenever the true azimuth of the LOS (TA) is required. The adjustment may be done according to formula 2 below.

$$TA=MO+MAV+TAF \qquad \text{Formula 2:}$$

Where:

MO (Magnetometer based inertial sensor Offset) denotes the known offset between the coordinates system of the magnetometer based inertial sensor(s) 130 and the LOS of the imaging sensor(s) 120.

MAV (Magnetometer Azimuth Value) denotes the current sensor based azimuth value obtained from the magnetometer based inertial sensor(s) 130.

TAF (True Azimuth Fix) denotes the offset between the sensor based azimuth and the actual azimuth calculated by the azimuth calculator 110.

The azimuth calculator 110 may execute the process 200 once, typically at beginning of operation, to calibrate the magnetometer based inertial sensor(s) 130 with the computed MO offset.

Optionally, the azimuth calculator 110 repeats the process 100 according to one or more predefined conditions, for example:

Every predefined period of time, for example, every minute, every hour and/or the like.

Upon detecting a change in the sensor based azimuth that exceeds a predefined threshold value, for example, 10 degrees in any direction.

Upon geographical location change.

Upon elevation change.

Upon request of one or more azimuth users, for example, an application, a user and/or the like to get an updated azimuth value.

By repeating the process 200, the azimuth calculator 110 may re-compute the MO offset to maintain an accurate true azimuth value TA over time, over location/elevation changes and/or the like.

As shown at 222, the azimuth calculator 110 may provide the true azimuth which may be the sensor based azimuth adjusted with the computed offset TAP.

It is expected that during the life of a patent maturing from this application many relevant technologies and/or methodologies will be developed and the scope of the terms AHRS systems, inertial sensors, location sensors is intended to include all such new technologies a priori.

As used herein the term "about" refers to=10%.

The terms "comprises", "comprising", "includes", "including", "having" and their conjugates mean "including but not limited to".

The term "consisting of" means "including and limited to".

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

What is claimed is:

1. A system for improving azimuth accuracy of a Line Of Sight (LOS) by adjusting an azimuth value obtained from at least one magnetometer based inertial sensor according to the sun position, comprising:
   at least one magnetometer based inertial sensor;
   at least one imaging sensor;
   at least one location sensor; and
   at least one processor coupled to said at least one magnetometer based inertial sensor, said at least one location sensor and said at least one imaging sensor, said at least one processor is adapted to execute a code, said code comprising:
   code instructions to obtain a location, elevation and time from said at least one location sensor,
   code instructions to obtain a sensor based azimuth value of a LOS of said at least one imaging sensor from said at least one magnetometer based inertial sensor,
   code instructions to obtain at least one image captured by said at least one imaging sensor, said at least one image depicting the sun,
   code instructions to calculate an actual azimuth value of said LOS according to said location, said elevation and said time with respect to a center of the sun computed by analyzing said at least one image, and
   code instructions to adjust automatically said sensor based azimuth value according to said actual azimuth value.

2. The system of claim 1, wherein said at least one magnetometer based inertial sensor is provided by an Attitude and Heading Reference system (AHRS).

3. The system of claim 1, wherein said code further comprising code instruction to determine whether the sun is in a field of view of said at least one imaging sensor based on said location, said elevation and said time.

4. The system of claim 1, wherein said code further comprising code instructions to convert said at least one image to a binary image in which each pixel in said at least one image is represented by one of two pixel values.

5. The system of claim 1, wherein said code instructions for calculating said actual azimuth value comprise code instructions for computing said center according to a perimeter of the sun identified in said at least one image by said analyzing which employs image processing.

6. The system of claim 1, wherein said code instructions for calculating said actual azimuth value comprise code instructions for computing said center according to an intersection point of at least two sun light rays identified in said at least one image by said analyzing which employs image processing.

7. The system of claim 1, wherein said code instructions for calculating said actual azimuth value comprise code instructions for computing said center by identifying an inner perimeter and an outer perimeter of a halo of the sun identified in said at least one image by said analyzing which employs image processing.

8. The system of claim 1, wherein said code further comprising code instructions to analyze at least one additional image captured by said at least one imaging sensor said to continuously maintain said adjusted sensor based azimuth value according to said actual azimuth value.

9. The system of claim 1, wherein said code further comprising code instructions to calibrate a positioning of said at least one imaging sensor compared to said positioning of said at least one magnetometer based inertial sensor to align said LOS with said at least one magnetometer based inertial sensor.

10. A computer implemented system of improving azimuth accuracy of a Line Of Sight (LOS) by adjusting an azimuth value obtained from at least one magnetometer based inertial sensor according to the sun position, comprising:
   obtaining a location, elevation and time from at least one location sensor;

obtaining a sensor based azimuth value of a LOS of at least one imaging sensor from at least one magnetometer based inertial sensor;

obtaining at least one image captured by said at least one imaging sensor, said at least one image depicting the sun;

calculating an actual azimuth value of said LOS according to said location, said elevation and said time with respect to center of the sun computed by analyzing said at least one image; and adjusting automatically said sensor based azimuth value according to said actual azimuth value.

* * * * *